United States Patent [19]

Difrancesco

[11] Patent Number: 5,083,697

[45] Date of Patent: * Jan. 28, 1992

[54] PARTICLE-ENHANCED JOINING OF METAL SURFACES

[76] Inventor: Louis Difrancesco, 31032 Hershey Wy, Hayward, Calif. 94544

[*] Notice: The portion of the term of this patent subsequent to Feb. 14, 2006 has been disclaimed.

[21] Appl. No.: 479,696

[22] Filed: Feb. 14, 1990

[51] Int. Cl.⁵ ...................... B23K 20/00; B23K 20/16
[52] U.S. Cl. ................................... 228/116; 228/177; 228/208; 228/248; 228/265
[58] Field of Search ............... 228/115, 116, 177, 208, 228/248, 265, 263.17

[56] References Cited

U.S. PATENT DOCUMENTS

| | | |
|---|---|---|
| 3,100,933 | 8/1963 | Hancock et al. |
| 3,203,083 | 8/1965 | Obenhaus |
| 3,482,726 | 12/1969 | Schroeder, Jr. |
| 3,555,664 | 1/1971 | Bingham et al. |
| 3,632,319 | 1/1972 | Hoppin et al. |
| 3,700,427 | 10/1972 | Hoppin, III et al. |
| 3,818,415 | 6/1974 | Evans et al. |
| 3,921,885 | 11/1975 | Knox |
| 4,606,778 | 8/1986 | Jahnke |
| 4,804,132 | 2/1989 | DiFrancesco |
| 4,814,040 | 3/1989 | Ozawa |

FOREIGN PATENT DOCUMENTS

| | | |
|---|---|---|
| 0154652 | 4/1982 | Fed. Rep. of Germany |
| 54-17359 | 2/1979 | Japan |
| 63-49382 | 3/1988 | Japan |
| 63-264283 | 11/1988 | Japan |
| 87087 | 3/1989 | Japan ................... 228/116 |
| 893469 | 5/1982 | U.S.S.R. |
| 1333511 | 8/1987 | U.S.S.R. |
| 1447611 | 12/1988 | U.S.S.R. ............... 228/248 |
| 2158757 | 11/1985 | United Kingdom |

OTHER PUBLICATIONS

Hogerton et al., 3M/I&E Sector Labs, 3M Center, pp. 1-10.

Haufler et al. (1986) Proc. Conf. *High Temperature Alloys for Gas Turbines*... D. Reidel, eds. pp. 801-810.

*Primary Examiner*—Samuel M. Heinrich

[57] ABSTRACT

A method for joining a first metal surface to a second metal surface employs metallized particles or protuberances disposed between said surfaces. The metallized particles include a core particulate composed of a material having a hardness greater than that of the metals to be bonded. By compressing the metal surfaces together in a generally normal or perpendicular direction, one or both of the metal surfaces is compressed into a metal region formed around the particulate core. In this way, very high local regions of stress are created which cause the metal to elastoplastically deform, enhancing the ability to form diffusion bonds. Alternatively, temporary electrical or other junctions may be formed by bringing the surfaces together under less rigorous conditions and/or using metals which are incapable of forming diffusion bonds.

39 Claims, 5 Drawing Sheets

PARTICLE-ENHANCED JOINING OF METAL SURFACES

BACKGROUND OF THE INVENTION

The subject matter of the present application is related to that of U.S. Pat. No. 4,804,132, naming Louis DiFrancesco as the sole inventor, which issued on Feb. 14, 1989.

1. Field of the Invention

The present invention relates generally to the mechanical, electrical, and thermal connection of metal surfaces and, more particularly, to methods for forming permanent and temporary junctions between metal surfaces having metallized particles therebetween.

Numerous techniques exist for joining metal surfaces together. Typical examples include the use of fasteners, adhesives, solders, and the like, as well as various welding and ultrasonic bonding methods. Of particular interest to the present invention are compression bonding techniques where opposed metal surfaces are brought in contact and bonded by applying sufficient pressure, and optionally heat, to cause metallic or electron bonding between adjacent metal molecules. When heat is applied in addition to pressure, such bonding methods are referred to as thermocompression bonding.

The amount of pressure, and optionally heat, required to achieve compression bonding will vary depending on a variety of circumstances. For example, soft metals having a relatively low melting point can usually be bonded under less rigorous conditions than harder metals having higher melting points. Similarly, permanent bonds having a strength generally equal to that of the bulk metal being joined generally require more rigorous bonding conditions than do temporary bonds having a strength much less than that of the bulk material. Of course, the longer exposure times can in some cases provide bonds having strengths equal to that achieved under more rigorous conditions for lesser times. Finally, the surface area of the bond has a substantial impact on the amount of energy in the form of temperature and pressure which must be applied. Compression bonding techniques which are suitable for very small areas are often difficult or impossible to achieve with very large areas of metal to be joined.

Under many circumstances, it would be desirable to employ lower pressures and/or to eliminate the need to use heat while being able to achieve the same quality of bond achieved using more rigorous conditions. In particular, it would often be desirable to utilize reduced pressure and/or temperature without the need to extend the time required for effecting bonding. Such compression bonding techniques which utilize reduced pressure and temperature would find particular use in the electronics industry in various interconnection applications, such as die attach, peripheral pad bonding, wire bonding, tape bonding, and other electrical conductor bonding situations. In such applications, it would also be desirable to be able to form temporary bonds, allowing automatic testing of associated circuitry, prior to forming permanent bonds.

Under other circumstances, it would be desirable to be able to make compression bonds over relatively large surface areas without excessive pressure or heat requirements. For example, it may be desirable to join metallic structural members over large areas to assure the strength and integrity of the resulting joint. Because of the large size and mass of such structural members, however, the heat requirements which have heretofore been necessary to achieve thermocompression bonding or welding would often result in deforming or altering material properties of the structural element. Additionally, it is often very difficult to apply pressure to large members in the manner required for forming compression bonds, and it is often difficult or impossible to employ compression bonding techniques in the field.

As described in more detail hereinbelow, the methods of the present invention are broadly applicable in many diverse metal bonding applications and enjoy a number of specific advantages which are enumerated.

2. Description of the Background Art

U.S. Pat. No. 4,814,040, describes a method for connecting electrical contact pads employing an adhesive layer which contains a plurality of metallic particles. The particles penetrate into the contact pads to enhance electrical contact, but no diffusion bonding between the pads or between the particles and the pads is disclosed. U.S. Pat. No. 3,818,415, discloses a method for electrically coupling a terminal to a conductor coated with an insulating layer. Fine particles of grit are adhered to the conductor and coated with a soft metal. The grit scores the insulating layer as the terminal is moved thereacross, and electrical conduction is established by the soft metal. No bonding between the metal and conductor is disclosed. Japanese patent 63/264283, describes diffusion bonding of nickel alloy surfaces having a nickel alloy powder therebetween. U.S.S.R. patents 1333511 and 893469, describe diffusion welding of metal surfaces having a metallic powder therebetween. Japanese patent 63/049382, describes diffusion bonding between metals using an insert layer having low melting point and high melting point particulates therebetween.

SUMMARY OF THE INVENTION

The present invention comprises a method for joining metal surfaces together by elasto-plastic deformation of at least one of the surfaces which can result in diffusion bonding. The surfaces are brought together and a compressive force applied in a direction which is substantially normal to the resulting interface between the metal surfaces. The amount of pressure and optionally heat required to effect diffusion bonding between the surfaces may be reduced by the placement of metallized particles along said interface between the surfaces. The metallized particles include a particulate core formed from a relatively hard material, typically a natural or synthetic ceramic, mineral, or metal covered at least in part by a softer metal. In a first embodiment, the particles are protuberances on one or both of the surfaces formed by depositing a soft metal layer over hard particulate cores which have been distributed on a substrate. The metal layer then acts as the surface which is to be bonded. In a second embodiment, discrete metal coated particulate cores are distributed over one or both of the metal surfaces. The particulate materials will be selected to be harder than the metals being joined so that, as the surfaces are compressed together, regions of localized stress are created at the contact points between the metal surfaces. The resulting localized stress will cause elasto-plastic deformation of adjacent regions on metal surfaces, which can allow diffusion bonding to occur with an overall reduction in temperature and pressure requirements. The surfaces to be joined will usually be composed of the same metals or metal alloys, although any two dissimilar metals which can be diffusion bonded will be amenable to bonding by the method of the present invention. Moreover, when only electrical or thermal connection are desired, the metals may be dissimilar and incapable of diffusion bonding.

The method of the present invention enjoys numerous advantages over and offers capabilities not often found in previous diffusion bonding techniques. Often, the method of the present invention allows diffusion bonding without the application of external heat (although the present invention does not exclude the use of heat when desired). The present invention may be used with virtually any metal or combination of metals which are amenable to diffusion bonding: The bonding methods can be used in very small applications, such as in the formation of electrical contacts in microcircuitry, as well as larger applications such as the formation of structural and mechanical joints, such as joining frame members to sheet members. The use of very small metallized particles allows the electrical connection to very small targets, such as conductor pads having dimensions on the order of one micron. The present invention can provide connections having enhanced electrical and thermal conductivity through the use of conductive particles as well as connections having reduced electrical and thermal conductivity through the use of insulating particles. Moreover, the bond strength between the metal surfaces can be increased by applying successively greater amounts of heat and pressure, allowing the selective formation of temporary or permanent bonds. By using electrically conductive particles, excellent electrical conductivity can be achieved even with temporary bonds having contact through the metallized particles. In this way, temporary bonds can be formed for testing of electronic circuits prior to final bond formation. Additionally, the present invention allows the formation of temporary or permanent electrical bonds even when one of the metal surfaces is covered with an insulating material, such as an insulating layer or an adhesive. The metallized particles will be able to penetrate the insulating layer allowing electrical contact and if desired, permanent formation of a diffusion bond.

While a primary advantage of the present invention is the ability to form permanent diffusion bonds under less rigorous conditions, the methods will also find use in forming temporary and fracturable junctions, particularly electrical junctions, between metal surfaces under conditions where diffusion bonding does not occur. In particular, a structure according to the present invention having fixed metallized protuberances on a surface thereof can be used to form very low resistance electrical connections with another metal surface, even when the metals involved are incapable of forming a diffusion bond. Such structures will be particularly useful in forming temporary electrical connections in electrical test equipment, such as in probes used to connect to electronic microcircuitry.

These and other advantages will be discussed in greater detail in the Description of the Specific Embodiments which follows.

DESCRIPTION OF THE PREFERRED EMBODIMENTS

Figure 1:
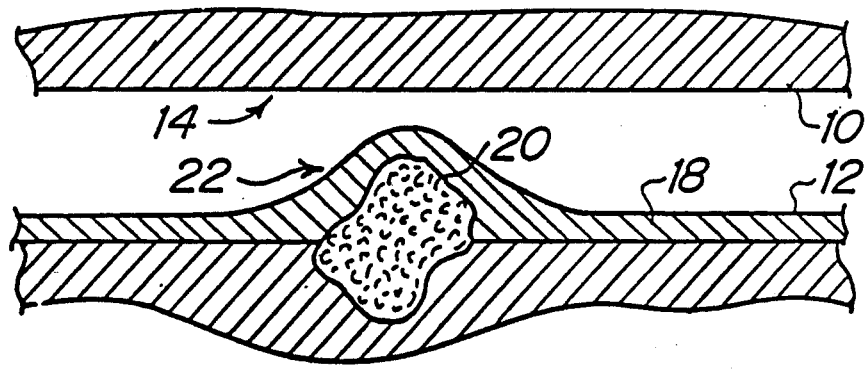
FIGS. 1-3 illustrate a first embodiment of the method of the present invention where a metal layer is formed over a hard particulate which has been located on a substrate surface.

According to a primary aspect of the present invention, metal surfaces are joined by diffusion bonding. The temperature, pressure, and time required to achieve a desired diffusion bond may be reduced and the electrical and mechanical properties of the bond enhanced by the use of metallized particles having a particulate core which is harder than the metals being bonded. The metallized particles are disposed between the surfaces as they are brought together causing localized regions of very high stress. Such high localized stress results in elasto-plastic deformation of the metal and allows electron bonding to occur in at least those regions.

The method of the present invention will be able to join surfaces composed of virtually any metal which is amenable to diffusion bonding. Usually, the surfaces to be joined will be composed of the same metal or metal alloy, although certain dissimilar metals may also be joined. Exemplary metals known to form diffusion bonds include aluminum, platinum, titanium, tungsten, chrome, nickel, gold, silicon, iron, copper, cobalt, silver, molybdenum, lead, tin, indium, and various alloys thereof.

In a secondary aspect of the present invention, metals which are incapable of forming diffusion bonds may be employed to provide structures intended for forming temporary electrical (and optionally thermal) junctions or connections, such as between test equipment and a circuit to be tested. The structures will be substantially the same as those which are intended to form diffusion bonds, except that the metal of the metallized particles need not be capable of forming a diffusion bond with the other metal surface under the conditions under which the surfaces are brought together. It has been found that the presence of the metallized particles can substantially enhance electrical conductivity between the surfaces over that which would result if the surfaces were brought together without the particles.

The metal surfaces may be part of a laminate or non-laminate structure. In the case of laminate structures, the metal surface will usually be the final exposed layer formed over one or more underlying substrate layers, where the substrate layers may be metals, non-metals, or both. Such laminate structures may be formed by a wide variety of industrial processes. For example, the metal surface may be an electrical contact pad formed as part of an electric structure, such as an integrated circuit (die), a ceramic or plastic package, a mother board, a printed circuit board, splices, and corresponding larger structures, where numerous conductive and insulating layers are formed in combination with various circuit components. Such electronic structures are conventionally formed by photolithographic techniques. For such laminate structures, the metal surface layer may be as thin as one micron or as thick as 1 cm, or thicker.

Alternatively, the metal surface may simply be the exposed outer surface of a non-laminate metal member, such as a conductor, wire, mechanical element, or the like.

In particular embodiments of the present invention, the metal surface to be joined may be wholly or partly covered by a non-metallic layer or a metallic layer which does not form part of the diffusion bond. For example, an electrical conductor which is to be bonded to another electrical conductor or contact pad may be covered with a thin insulating or adhesive layer. In such cases, metallic particles on the mating metallic surface will be able to penetrate the cover layer allowing bonding between the metal which covers the particle and the metal beneath the cover layer.

The metal surfaces to be bonded may have a wide variety of geometries including flat, curved, and irregular. Generally, however, the two surfaces to be bonded must have complementary profiles so that they may be brought together along a common interface where the diffusion bonding occurs. In some cases, however, the two surfaces may have non-complementary profiles and it may be necessary to bend or otherwise conform the mating surfaces together.

The present invention will find the greatest use with flat or planar surfaces and substrates which are to be joined to other flat or planar metal surfaces or substrates. A particular advantage of the present invention, however, is that the flat surface need not be perfectly flat to achieve either bonding or temporary electrical connection. The metallized particles or protuberances may be selected to be sufficiently large to extend across any gaps or spaces which may remain between the adjacent surfaces. For electrical connections, typical surface flatnesses will be on the order of 1 $\mu$m/mm for die surfaces, 5 mil/inch for lead contacts, and 10 mil/inch for printed circuit boards.

The surface area to be bonded may also vary widely. In microelectronic applications, the areas being bonded will typically be very small, usually being from about 20 $\mu$m$\times$20 $\mu$m to about 1250 $\mu$m$\times$1250 $\mu$m, more usually being from about 50 $\mu$m$\times$50 $\mu$m to about 625 $\mu$m$\times$625 $\mu$m. For mechanical bonding, the areas joined may be much larger, frequently being on the order of cm$^2$ or larger. It will be appreciated, however, that the entire interface area between adjoining surfaces need not be uniformly bonded. That is, diffusion bonding may occur in the region immediately surrounding a metallized particle and may be absent from regions which lack the metallized particles. In such cases, the metallized particle density is selected to be sufficiently high to provide for a desired strength of bond as well as desired mechanical and thermal conductivities. It will also be possible to form bonds only within discrete regions on a larger surface, either by selective applications of the metallized particles, or pressure, or both.

As discussed in more detail hereinbelow, the metallized particles may be used to form fixed protuberances in at least one of the metal surfaces to be bonded or may be distributed onto the metal surface without any form of attachment. The metallized particles comprise a relatively hard particulate core having a metal coating or covering, where the metal is selected to be compatible with the metal surfaces which are to be joined. When the metallized particles are fixed to an underlying substrate, there is usually a continuous metal layer covering both the substrate and the particles, where said metal layer usually constitutes the surface which is to be bonded. Conveniently, the core particulates may be distributed on a metallic or non-metallic substrate and the metal surface layer formed over the particulates and the substrates by conventional plating or deposition techniques. Alternatively, discrete metallized particles may be distributed over the first metal surface, with diffusion bonding occurring between the metallized particles and both the first and second surfaces as they are brought together. The metal in the metallized particles will thus act as a bridge between the two adjacent metal surfaces.

By employing particulate core materials which are harder than the metals to be bonded, the particles will resist deformation as the surfaces are compressed together, with the particles causing very high localized stress regions. Usually, the core particulates will have irregular geometries with relatively sharp edges which further enhance the ability to penetrate into the metal layers surrounding the particle as the surfaces are compressed. Such high stress regions will enhance diffusion bonding for the reasons discussed above.

A variety of natural and synthetic materials are suitable for use as the core particulates. Generally, the particles should be harder than the metals being joined, usually having a hardness greater than about 5.5 mohs, preferably having a hardness above about 7.0 mohs, more preferably having a hardness above about 8.0 mohs, and even more preferably above about 9.0 mohs. Suitable particulate core materials include natural minerals, such as diamond, corundum (sapphire), magnetite, garnet, quartz, quartzite, silica, and the like, as well as synthetic materials including oxides, such as aluminum oxide (sapphire), nitrides such as boron nitride and silicon nitride, carbides such as tungsten carbide and silicon carbide, and the like. When relatively soft metals are being bonded, relatively harder metal particulates may be employed, such as ground silicon, nickel, zinc crystals, iron crystals, aluminum crystals, and the like.

The particulate core materials may be electrically conductive, semi-conductive, or insulating, and may also display a range of thermal conductivities. The core material must however be selected to be compatible with the metals which are being bonded, as not all core particulates can be suitably coated with all metals.

The dimensions of the particulate core will be selected based on the nature of the surfaces or substrates to be bonded, with smaller particulate cores being compatible with more closely conforming surfaces. Smaller particulate cores will also be compatible with smaller surface areas to be bonded and thinner exposed surface layers. Conversely, larger particulate cores may be used in many mechanical bonding operations where relatively large members or elements are to be bonded. The size of suitable particulate cores may vary widely, generally being in the range from about 1 $\mu$m to about 2.5 mm, usually being in the range from about 5 $\mu$m to about 100 $\mu$m. The particulates used in any given application need not all be of a single size, and may instead be present within a given range of sizes.

The metallized particles may be formed separately from a metal surface to be bonded or may be formed as part of such surface. Separate formation may be achieved by a variety of conventional metal coating techniques, including electroplating, electroless plating, chemical vapor deposition (CVD), sputter deposition, evaporation, and the like. Similar metal coating techniques may be employed when the particulate cores are dispersed over a metal or non-metal substrate in order to form a metal surface having fixed protuberances thereon.

The metallized particles or protuberances will be present on a metal surface or associated substrate at a surface density selected to provide a desired bonding strength, electrical conductivity, and thermal conductivity, as well as to accommodate the particulate core size or range of sizes. As an upper limit, the metallized particles may be present at a density where the pitch between adjacent particles is substantially equal to the particle size. Frequently, the particles will be present at a much lower density so that substantial regions of the metal surface or other substrate remain free from the particles. Exemplary metallized particle densities will be in the range from about 50 particles/mm$^2$ to 10,000 particles/mm$^2$, usually being in the range from about 500 particles/mm$^2$ to about 3000 particles/mm$^2$, typically being in the range from about 1000 particles/mm$^2$ to about 2000 particles/mm$^2$.

Metallized particles and non-metallized particulate cores may be deposited on a metal surface or other substrate by a variety of techniques. Most simply, the particles can be plated by incorporation into a conventional plating bath where the particles become embedded in a resulting plated layer. The plating of particulates onto metal surfaces and other substrates is commonly practiced in the composite abrasives industry, and suitable techniques are described in Kirk and Othmer, *Encyclopedia of Chemical Technology*, 3rd. Ed., John Wiley & Sons, New York (1978), Vol. 1, pp. 26–52, the disclosure of which is incorporated herein by reference. Other suitable techniques for attaching the metallized particles or non-metallized particulate cores to a surface include reverse transfer molding and the use of adhesive films and liquids. Alternatively, the particles may be incorporated into a suitable ink base and applied by various printing techniques, such as silk screen printing. Incorporation of the particles into a liquid, such as ink, is advantageous when the process is to be carried out in a clean environment, such as a microelectronic clean room, where particulate contamination is problematic. Additionally, by using an ink or an organic carrier which can be patterned by photolithography, very fine surface geometries can be created.

Once the metal surfaces to be joined are prepared by any of the methods described above, they will usually be cleaned in order to remove any debris, grease, or other contaminants which may be present. Cleaning may be achieved using suitable solvents, chemicals, or alternatively by plasma etching. While the surfaces will normally be clean, it will be appreciated that the method of the present invention can provide excellent mechanical, electrical, and thermal connections even when the surfaces are contaminated or covered with an adhesive or insulating layer.

After the cleaning steps, if any, the surfaces are brought together so that the metallized particles or protuberances along either or both of the surfaces meet at the interface created therebetween. Pressure is then applied to the surfaces in order to provide a compressive force along the interface so that the hardened particulate cores cause adjacent metal regions in the surfaces to undergo elasto-plastic deformation and flow together so that metallic or electron bonding can occur. The pressure may be applied uniformly over the entire surface area to be bonded, typically using a mechanical press, clamp, or other device for applying a uniform pressure gradient. Alternatively, pressure may be applied in a localized manner using a roller, mechanical punch, or the like, where the entire area to be bonded can be covered by a series of sequential pressure applications. The amount of pressure or force applied to the surfaces will depend on the nature of the surfaces, the shape and size of the metallized particles, and on the desired strength of the resulting bond. Pressures as low as 0.01 gram/mil$^2$ or lower may be utilized when temporary bonds are desired. While pressures as high as 10 gram/mil$^2$ or higher may be utilized when permanent diffusion bonds are desired.

In addition to pressure, heat may be optionally applied in order to effect the desired diffusion bond. The amount of heat applied also depends on the nature of the surfaces being joined, the nature of the metallized particles, and the nature of the desired bond strength. Frequently, heat may be used in order to lessen the amount of pressure required in order to form a given bond with particular materials. In other cases, however, heat may be necessary in order to achieve the desired diffusion bond. Conveniently, heat may be applied by the same device which is used to provide pressure to the opposed surfaces. For microelectronic applications, thermodes for achieving thermocompression bonding are well known. See, for example, U.S. Pat. No. 4,804,810, the disclosure of which is incorporated herein by reference. Alternatively, heat may be provided by a separate source, such as a separate radiant heat source.

A third parameter in achieving a desired bond strength is bonding time. For a given application of pressure (and optionally heat), the cumulative time of exposure will determine the degree of permanence or strength of the bond. That is, a very short exposure time may result in a temporary junction or joint while a longer exposure time may result in a permanent diffusion bond. Frequently, it will be desirable to first form a temporary junction or joint, either to allow circuit testing in electronic applications or to allow fitting of pieces in mechanical applications. After the surface has been tested or fitted, a permanent diffusion bond can be formed by a longer exposure time to pressure (and optionally heat), or by increasing the pressure and/or temperature.

Figure 2:
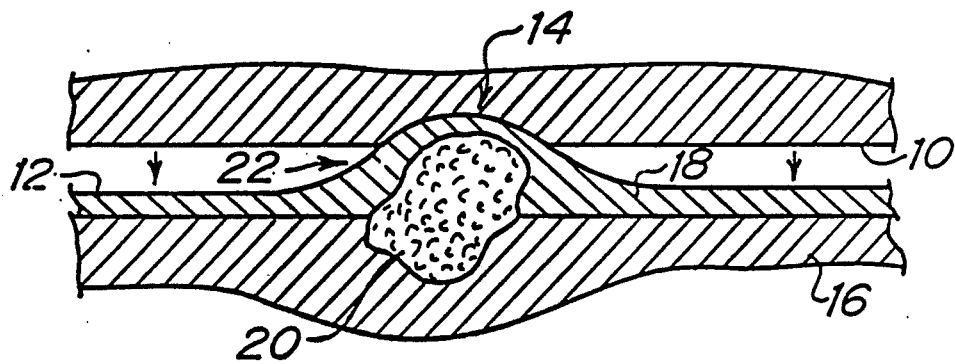
Figure 3:
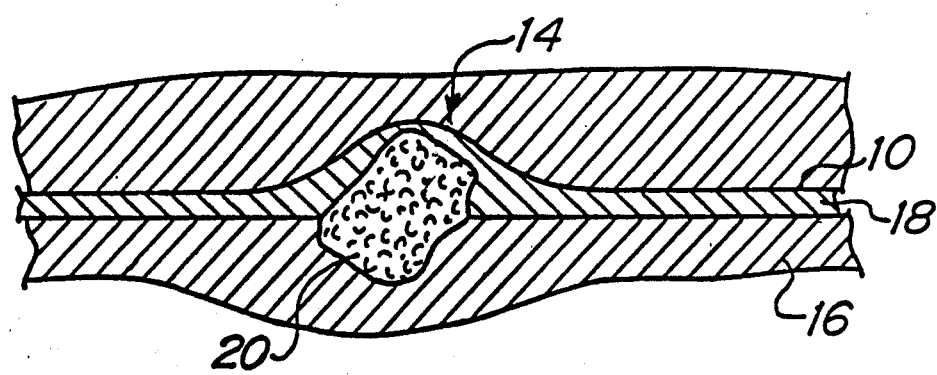

Referring now to FIGS. 1–3, the method steps for joining a first metal surface 10 to a second metal surface 12 are illustrated. As described above, the first metal surface 10 may comprise a laminate structure having a plurality of metal and/or non-metal layers, with the only requirement being that an exposed surface thereof be composed of a metal or metal alloy, at least in a selected region 14 where joining will occur.

The second metal surface 12 includes at least one substrate layer 16 formed beneath an exposed metal layer 18. The substrate 16 may be metal or non-metallic, and the metal of layer 18 will be selected to be compatible with both the material of substrate 16 and with the metal of the first metal layer 10. Usually, the metal layer 12 will be the same metal or metal alloy as is the first metal layer 10. A core particulate 20 is deposited on the substrate 16 by any of the techniques described above. For example, the core particulate may be deposited by plating, reverse transfer molding, use of adhesives, ink printing, and the like. For ease of description, only one core particulate 20 is illustrated. The present invention, of course, may employ more than one and will frequently employ hundreds, thousands, or more, in any given application.

The second metal layer 12 is then formed over both the substrate 16 and the core particulate 20 by suitable deposition techniques, such as CVD, sputter deposition, plating, and the like. The build up of metal over particulate 20 during the deposition causes a protuberance 22 to form in the metal surface 12.

In order to form the desired compression bond, the metal surfaces 10 and 12 are brought together with a compressive force in the direction of arrows 24 (FIG. 2), which is generally normal to the plane of interface between the two surfaces. Compression of the surfaces 10 and 12 causes the metal in region 14 of surface 10 and the metal in the protuberance 22 of surface 12 to experience very high localized compressive pressure. Such pressure causes elasto-plastic deformation which results in outward lateral flow of the metal(s) in both the region 14 and the protuberance 22. Such metal flow allows electron bonding to occur between metal molecules on the adjacent surfaces, resulting in the desired diffusion bond.

Electron bonding at the molecular level eventually results in a diffusion bond having a strength equal to that of the parent or bulk metal which is being joined, at least between the region 14 and the protuberance 22. Moreover, the strength of the bond increases as the surfaces 10 and 12 are forced more closely together. When the region 14 first touches the protuberance 22, there will be substantially no mechanical bonding, although there will be some electrical and thermal conductivity established. Mechanical bonding, however, will quickly follow as the surfaces 10 and 12 are brought more closely together, with an intermediate level of bonding illustrated in FIG. 2 and a more substantial degree of bonding illustrated in FIG. 3. The final strength of bonding will depend on the level of pressure and optionally heat applied to the bonding region as well as the cumulative time of pressure and heat application.

A particular advantage of the illustrated bonding technique is that formation of an intermediate bond, as illustrated in FIG. 2, allows testing, sizing, and other performance evaluation of the structure being formed. If for some reason the structure fails in such evaluation, the surfaces 10 and 12 may be separated without causing excessive damage to either surface. If the structure evaluation is positive, the bonding operation can be completed by the additional application of pressure and optionally temperature. Another advantage of the structure is that the nature of the bond may be affected by the nature of particle 20, with electrically conductive particles enhancing the electrical conductivity of the bond and electrically insulating particles limiting the electrical conductivity of the bond. Similarly, the thermal conductivity of the bond may be effected by the thermal conductivity of the particle 20. Moreover, the use of mechanically strong particles 20 can enhance the shear strength of a joint or junction, even when the compression joint is only partly formed.

Figure 4:
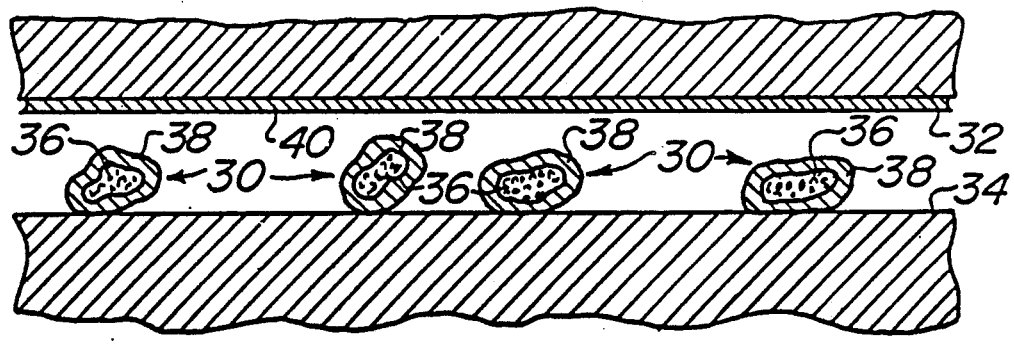
FIGS. 4-6 illustrate a second embodiment of the method of the present invention, where a plurality of metallized particles have been distributed on a first metal surface and where an insulating layer has been formed on a second metal surface which is to be joined to the first metal surface.
Figure 5:
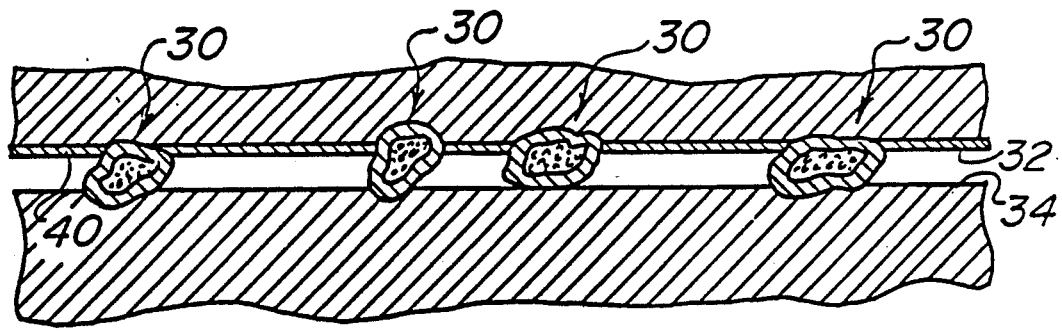
Figure 6:
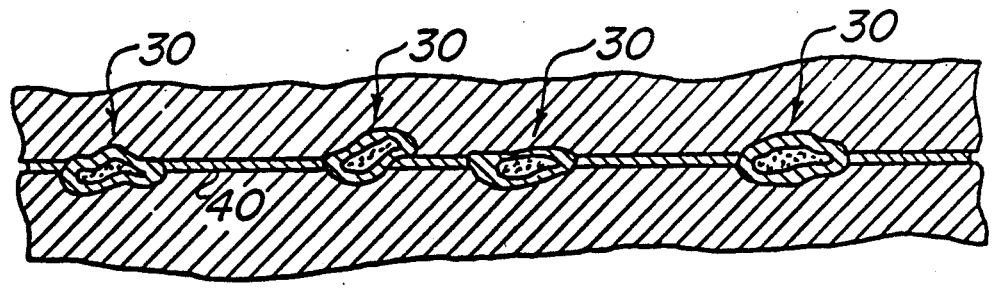
Figure 7:
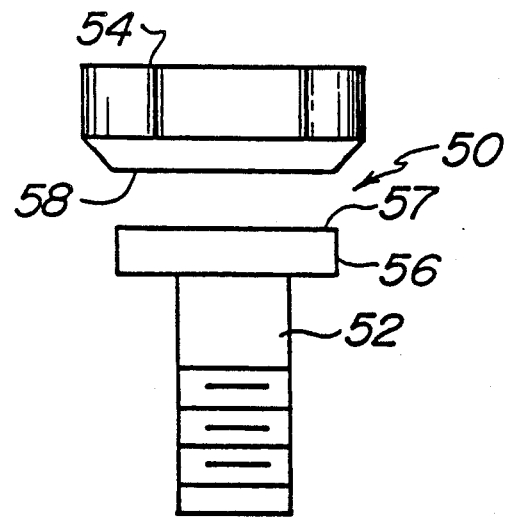
FIGS. 7-11 illustrate a method for fabricating a fracturable bolt according to the present invention.

Referring now to FIGS. 4-6, the use of metallized particles 30 in joining a first metal surface 32 to a second metal surface 34 will be described. Each metallized particle 30 comprises a particulate core 36 which is at least partly coated with a metal layer 38. Optionally, an insulating (or adhesive) layer 40 may be formed over the first surface 32.

As illustrated, metallized particles 30 are preformed, as described above, and loosely distributed over the second metal surface 34. Optionally, metallized particles 30 may be immobilized in some manner, typically by plating, the use of an adhesive, or the like. The metal of metal coating 38 will be compatible with both the metals of layer 32 and 34. More specifically, the metal of layer 38 may be capable of forming diffusion bonds with the metals of surfaces 32 and 34, while it is not necessary that the metals of surface 32 and 34 be capable of forming diffusion bonds with each other. Usually, surfaces 32 and 34 and layer 38 will be composed of the same metal or metal alloy so that the entire structure may be joined together.

As the metal surfaces 32 and 34 are brought together (FIG. 5), the presence of particulate core 36 causes the metal layer 38 in each metallized particle 30 to penetrate into both of the surfaces. With regard to the first metal surface 32, the metallized particles are able to penetrate through the insulating layer 40, establishing electrical and thermal contact between the surfaces. Additionally, the metal layer 38 will begin to diffusion bond with the metal in both the surfaces 32 and 34 by the physical mechanisms described above. The strength of the diffusion bond will increase as the pressure and optionally temperature continue to be applied, until the surfaces meet, as illustrated in FIG. 6.

A detailed description of a particular method for cold bonding aluminum surfaces together using particles according to the method of the present invention is described in U.S. Pat. No. 4,804,132, the disclosure of which has previously been incorporated herein by reference.

Another example of the method of the present application is illustrated in FIGS. 7-11, where a torque-limited or "break away" bolt 50 is illustrated. The bolt 50 includes a shank portion 52 and a separately formed head portion 54. The shank includes a flange 56 having a surface 57 which is joined to a surface 58 on the head 54. Typically, the head 54 will include a hexagonal periphery allowing the bolt 50 to be inserted using a conventional wrench (not illustrated). The flange 56, however, will usually have a circular periphery so that, after the head portion 54 is broken off, the shank 52 cannot be removed using a wrench.

Figure 8:
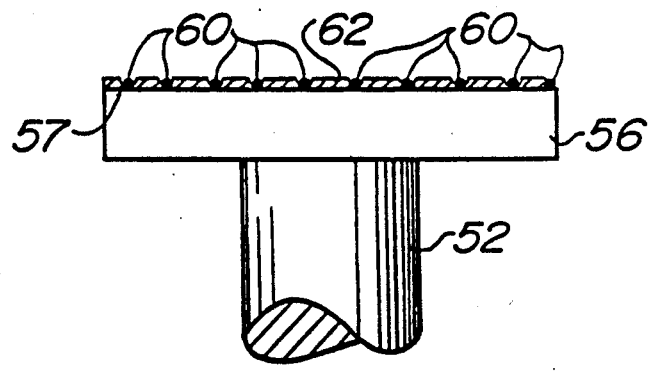

A bond between metal surfaces 57 and 58 which is designed to fail or fracture under a predetermined torsional stress may be formed as follows. The shank 52 and head portion 54 of the bolt 50 may be formed from common high strength metals, such as carbon steel or stainless steel. A plurality of particulate cores 60, typically silicon carbide having a mean particle size of about 50 μm, are applied by a conventional plating process, typically nickel plating. The resulting structure is illustrated in FIG. 8 where the particulate cores 60 protrude upwardly from a thin layer of nickel 62 formed over surface 57.

Figure 9:
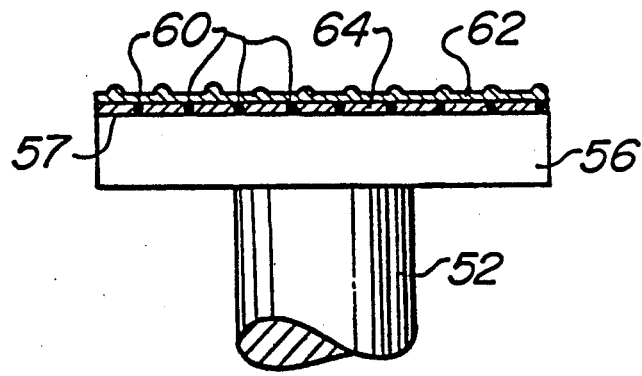

Once the particulate cores 60 are distributed over surface 57, a thin metal layer 64, typically aluminum, may be formed over the particulates by conventional processes, such as sputtering. The aluminum layer will typically be applied to a thickness of about 25 μm or less. The resulting structure is illustrated in FIG. 9.

Figure 10:
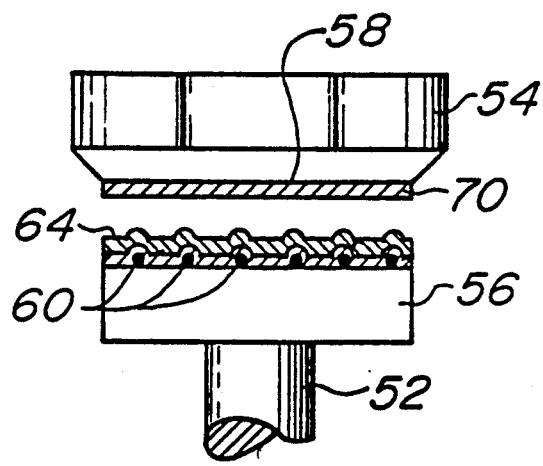
Figure 11:
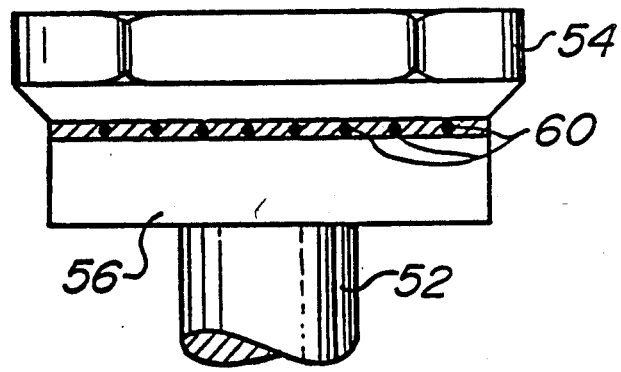

A second metal layer 70 is formed over surface 58 of the head portion 54, as illustrated in FIG. 10. The second metal layer will be capable of forming a diffusion bond with the first metal layer 64, typically also being aluminum. The head portion 54 is then compressed together with the shank portion 52 under a predetermined pressure so that diffusion bonding between the aluminum layers 64 and 70 occurs. The amount of pressure and time of contact are selected so that a diffusion bond having a predetermined strength is achieved. The resulting joint may be designed to break or fail under preselected torsional stress so that after the bolt is inserted into a desired location, the head portion 54 may be broken off to prevent tampering with the bolt. The particular stress level required for failure will depend on the number and size of the particulate cores 60, the thickness of the metal layers 64 and 70, as well as on the conditions of pressure, time, and optionally temperature, which are utilized to form the metallic joint. The final structure is illustrated in FIG. 11.

Figure 12:
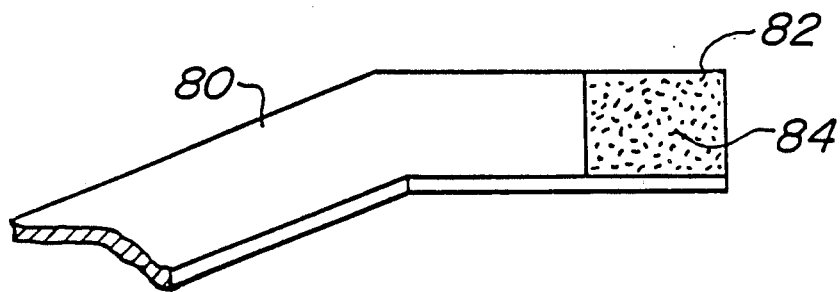
FIGS. 12 and 13 illustrate a method for forming temporary and permanent electrical connections according to the method of the present invention.
Figure 13:
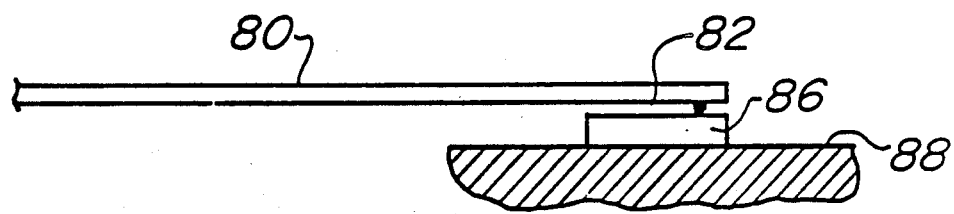

Referring now to FIGS. 12 and 13, a method for joining an electrical conductor 80, such as a lead in a lead frame used for tape automated bonding (TAB), to a contact pad 86, such as a contact pad on a semiconductor die 88, is illustrated. The electrical conductor 80 includes a connection region 82 at its distal end having a plurality of diamond particles formed in a monolayer thereon. The diamond particles are typically sized in the range from about 1 to 3 microns and are present at a density of about 1500 diamond particles/mm$^2$. The diamond particles may be plated onto the area of interest, typically by nickel plating. After plating, an aluminum layer having a thickness from about 1000 to 3000 Å (0.1 to 0.3 microns) is next applied, typically by sputtering. The contact region 82 is then compressed with the contact pad 86, as illustrated in FIG. 13. A temporary bond may be formed by the application of a low compressive pressure, typically about 0.01 gm/mil$^2$. Such temporary bond allows testing of the circuitry on die 88 prior to formation of a permanent bond. If the testing indicates that the die is operational, a permanent bond may be formed, typically by applying heat and pressure in amounts normally employed in thermocompression bonding. This method will apply to other metallurgies, including copper, soft solder, hard solder, gold alloys, titanium-overcoating, and the like.

Although the foregoing invention has been described in detail for purposes of clarity of understanding, it will be obvious that certain modifications may be practiced within the scope of the appended claims.

What is claimed is:

1. A method for joining a first metal surface to a second metal surface, said method comprising the steps:
   forming metallized particles having particulate cores with a hardness greater than that of the metal surfaces;
   applying the particles to at least one of the metal surfaces;
   bringing the surfaces together to form an interface; and
   applying a compressive force to the surfaces in a direction generally normal to said interface.

2. A method as in claim 1, wherein the particulate cores are embedded beneath at least one metal surface.

3. A method as in claim 2, wherein at least one metal surface has been formed over the particulate cores which are distributed on a substrate.

4. A method as in claim 1, wherein the metallized particles are at least partly coated with metal and distributed over at least one metal surface.

5. A method as in claim 1, wherein the first and second surfaces have generally complementary profiles.

6. A method as in claim 5, wherein the first and second surfaces are generally planar so that they meet along a generally planar interface.

7. A method as in claim 6, wherein the compressive force is applied in a direction which is generally normal with respect to the planar interface between the surfaces.

8. A method as in claim 1, wherein the surfaces are formed from the same metal.

9. A method as in claim 8, wherein the metal is selected from the group consisting of aluminum, platinum, titanium, tungsten, chrome, nickel, gold, silicon, iron, copper, cobalt, silver, molybdenum, lead, tin, indium, and alloys thereof.

10. A method as in claim 1, wherein the surfaces are formed from different metals which are incapable of forming a diffusion bond.

11. A method as in claim 1, wherein the particulate cores are composed of a material having a hardness greater than about 5.5 mohs.

12. A method as in claim 1, wherein the particulate cores are composed of a material having a hardness greater than about 7 mohs.

13. A method as in claim 1, wherein the particulate cores are composed of a natural mineral material selected from the group consisting of diamond, corundum (sapphire), magnetite, garnet, quartz, quartzite, silica, and tripoli.

14. A method as in claim 1, wherein the particulate cores are composed of a synthetic material selected from the group consisting of oxides, nitrides, and carbides.

15. A method as in claim 1, wherein the particles have a mean particle size in the range from about 1 μm to 2.5 mm.

16. A method as in claim 12, wherein the particles have an irregular geometry having sharp edges.

17. A method as in claim 12, wherein the particulate cores have a regular geometry.

18. A method as in claim 12, wherein the particles are present on the surface at a density from about 50 particles/mm$^2$ to 10,000 particles/mm$^2$.

19. A method as in claim 1, wherein a sufficient compressive force is applied for a sufficient time to form a permanent mechanical bond.

20. A method as in claim 1, wherein a sufficient compressive force is applied for a sufficient time to form a temporary mechanical bond.

21. A method as in claim 1, wherein the joint results in electrical coupling between the first and second metal surfaces.

22. A method for joining a first metal surface to a substrate, said method comprising:
   distributing hard particulate cores over at least selected portions of the substrate;
   forming a second metal surface over the particulate cores on the substrate, whereby metallized protuberances result, wherein said second metal surface is composed of the same metal as the first metal surface;
   positioning the first metal surface against the second metal surface; and
   applying a preselected compressive force to the first and second metal surfaces, whereby the surfaces are joined together at the locations of the protuberances.

23. A method as in claim 22, wherein the compressive force is applied substantially only in a direction normal to an interface between the metal surfaces.

24. A method as in claim 22, wherein the first and second surfaces have generally complementary profiles to define an interface as they are joined.

25. A method as in claim 24, wherein the first and second surfaces are generally planar so that they meet along a generally planar interface.

26. A method as in claim 25, wherein the compressive force is applied in a direction which is generally normal with respect to the planar interface between the surfaces.

27. A method as in claim 22, wherein the surfaces are composed of the same metal as the substrate.

28. A method as in claim 22, wherein the metal surfaces are composed of a metal selected from the group consisting of aluminum, platinum, titanium, tungsten, chrome, nickel, gold, silicon, iron, copper, cobalt, silver, molybdenum, lead, tin, indium, and alloys thereof.

29. A method as in claim 22, wherein the particulate cores are composed of a material having a hardness greater than about 5.5 mohs.

30. A method as in claim 22, wherein the particulate cores are composed of a material having a hardness greater than about 7 mohs.

31. A method as in claim 22, wherein the particulate cores are composed of a natural mineral material selected from the group consisting of diamond, corundum (sapphire), magnetite, garnet, quartz, quartzite, silica, and tripoli.

32. A method as in claim 22, wherein the particulate cores are composed of a synthetic material selected from the group consisting of oxides, nitrides, and carbides.

33. A method as in claim 22, wherein the particulate cores have a mean particle size in the range from about 1 $\mu$m to 2.5 mm.

34. A method as in claim 33, wherein the particles have an irregular geometry having sharp edges.

35. A method as in claim 33, wherein the particulate cores have a regular geometry.

36. A method as in claim 33, wherein the particles are present on the surface at a density from about 50 particles/$mm^2$ to 10,000 particles/$mm^2$.

37. A method as in claim 22, wherein a sufficient compressive force is applied for a sufficient time to form a permanent mechanical bond.

38. A method as in claim 22, wherein a sufficient compressive force is applied for a time insufficient to form a permanent mechanical bond.

39. A method as in claim 22, wherein the joint results in electrical coupling between the first and second metal surfaces.

* * * * *